United States Patent

Behrens et al.

[11] 3,975,683

[45] Aug. 17, 1976

[54] IN-CIRCUIT DIODE TESTER

[75] Inventors: Dieter Behrens; Heinz Klotzsche, both of Erlangen, Germany

[73] Assignee: Siemens Aktiengesellschaft, Munich, Germany

[22] Filed: Aug. 22, 1974

[21] Appl. No.: 499,777

[30] Foreign Application Priority Data
Aug. 31, 1973 Germany.............................. 2344015

[52] U.S. Cl............................................. 324/158 D
[51] Int. Cl.² ......................................... G01R 31/22
[58] Field of Search .................... 324/158 D, 158 T; 340/248 E, 253 E

[56] References Cited
UNITED STATES PATENTS
2,584,800   2/1952   Grisdale.............................. 324/110
3,594,641   7/1971   Hoel et al. ........................ 324/158 D OTHER PUBLICATIONS
Levy, I. J.; "Reverse–Current Tester"; Electronics; Jan. 3, 1958; pp. 88, 90.

Primary Examiner—R. V. Rolinec
Assistant Examiner—Ernest F. Karlsen
Attorney, Agent, or Firm—Kenyon & Kenyon Reilly Carr & Chapin

[57] ABSTRACT

An arrangement is described for testing diodes serially interposed in parallel feed lines between the terminals of a voltage source and corresponding d.c. bus bars. The arrangement provides for in-circuit check out of the diodes by providing a first switching means positioned in the feed line between one side of the diode to be tested and its corresponding voltage source terminal. A second switching means is connected to the other terminal of the voltage source, through an ammeter, to the side of the diode to be tested which is nearest the voltage source. The first switching means is opened and then the second switching means is closed which impresses across the diode a reverse voltage substantially equal to the terminal voltage of the voltage source. The ammeter provides a reading of the cut-off current flowing through the diode. A parallel arrangement including a voltmeter and resistor are provided for doing a reverse voltage check on the diode and a calibration check on the ammeter as required.

9 Claims, 2 Drawing Figures

IN-CIRCUIT DIODE TESTER

BACKGROUND OF THE INVENTION

1. Field of the Invention

This invention refers to an arrangement for testing diodes, and particularly to one which can test diodes while they remain in-circuit.

2. Description of the Prior Art

It has been known as a method for testing diodes, to remove the diodes from their circuit and impress upon them a separate d.c. voltage source — first in the forward direction and then in the reverse — and to monitor the current flowing therethrough by a suitable current measuring device. A suitable technique is described in the magazine "Funk-Technik" 1973, no. 7, p. 239.

However, the major drawback of this technique as well as other similar techniques is the fact that both terminals of the diode must be accessible for testing. It is therefore an object of the present invention to perform a diode check if only one diode lead is available.

It is a further object of this invention to provide a diode check utilizing the voltage source employed in the parallel feed circuit arrangement, without the need for a separate voltage source.

SUMMARY OF THE INVENTION

An arrangement is described for testing diodes serially interposed in parallel feed lines between the terminals of a voltage source and corresponding d.c. bus bars. The arrangement provides for in-circuit check out of the diodes by providing a first switching means positioned in the feed line between one side of the diode to be tested and its corresponding voltage source terminal. A second switching means is connected to the other terminal of the voltage source, through an ammeter, to the side of the diode to be tested which is nearest the voltage source. The first switching means is opened and then the second switching means is closed which impresses across the diode a reverse voltage substantially equal to the terminal voltage of the voltage source. The ammeter provides a reading of the cut-off current flowing through the diode. A parallel arrangement including a voltmeter and resistor are provided for doing a reverse voltage check on the diode and a calibration check on the ammeter as required.

In addition, to the cutt-off current check provided by the above, means are provided for doing a conduction or "on" check of the diodes. Towards this end, fuses are inserted in each of the parallel feed lines and a voltage measuring instrument is provided which monitors the voltage drop across the fuses to thereby obtain an indication of the on current of the diode.

Finally, protective diode means are provided for the ammeter and the voltage measuring device which is placed in parallel across the fuse. Also current limiting resistors are inserted in series with these latter measuring instruments. The diode and current limiting resistors provide necessary protection to the delicate meters.

BRIEF DESCRIPTION OF THE DRAWINGS

Reference is now made to the accompanying drawings for a better understanding of the nature and objects of the invention. The drawings illustrate the best mode presently contemplated for carrying out the objects of the invention and its principles, and they are not to be construed as restrictions or limitations on its scope. In the drawings.

DESCRIPTION OF THE PREFERRED EMBODIMENTS

Figure 1:
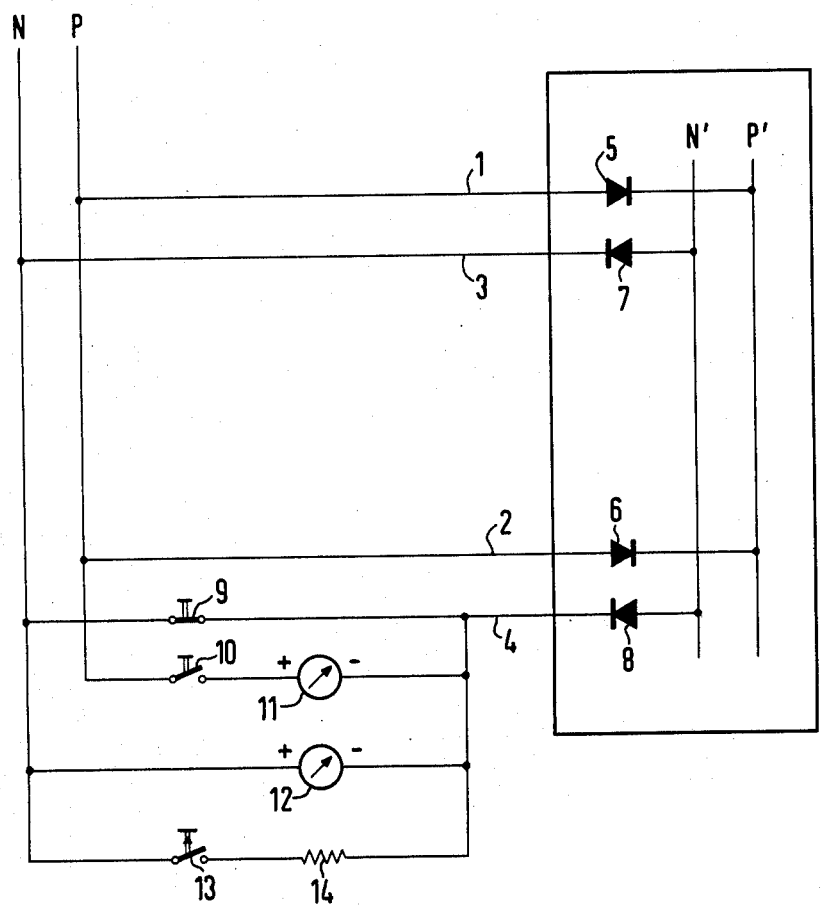
FIG. 1 is a schematic diagram of basic principles of the invention.

FIG. 1 shows the basic circuit diagram for the testing of the blocking function of the in-circuit diodes. A d.c. voltage source N, P feeds the bus bars, designated with N', P', of a d.c. installation via two respective parallel lines 1, 2 and 3, 4. The feed diodes associated with the positive bus bar P' are designated by 5 and 6 and those associated with the negative bus bar N', by 7 and 8. Each of the feed diodes are designed so that it can take over the rated current of the load. To this extent, the current feed system is redundant.

The testing of the blocking function will be illustrated by means of the example of the diode 8. In the feed line 4, containing the diode 8, a first switch 9 is provided. When opened the switch 9 disconnects the cathode of diode 8 from the negative pole N of the voltage source — with which it is connected in normal operation. Then, a switch 10 can be actuated, by which the positive pole P of the voltage source is connected with the cathode of the diode 8 via an ammeter 11. The diode 8 is thus subjected to reverse voltage and it can be checked by means of the ammeter 11 whether the cut-off current observed then is within the permissible range. Parallel to the switch 9, which is opened for checking the blocking function of the diode 8, a voltmeter 12 is provided. The voltage read at the voltmeter 12 corresponds to the reverse voltage applied to the diode 8 except for the voltage drop at the current-carrying diode 7. Since the cut-off current of the operative diodes is generally a low value which can scatter over a relatively wide range, it is advisable to check the operability of the ammeter 11 itself prior to the start of the cut-off current measurement. To this end, there is provided parallel to the voltmeter 12, and practically parallel to the diode 8, a resistor 14, which can be connected into the circuit by means of a key switch 13. The resistance value of resistor 14 corresponds to the minimum permissible cut-off current resistance. If the key 13 is depressed, with switch 9 open, the ammeter 11 will indicate approximately the maximally permissible cut-off current. Thus a functional check of the ammeter is provided. The blocking ability of the remaining feed diodes 5 to 7 can then be checked in a similar manner.

Figure 2:
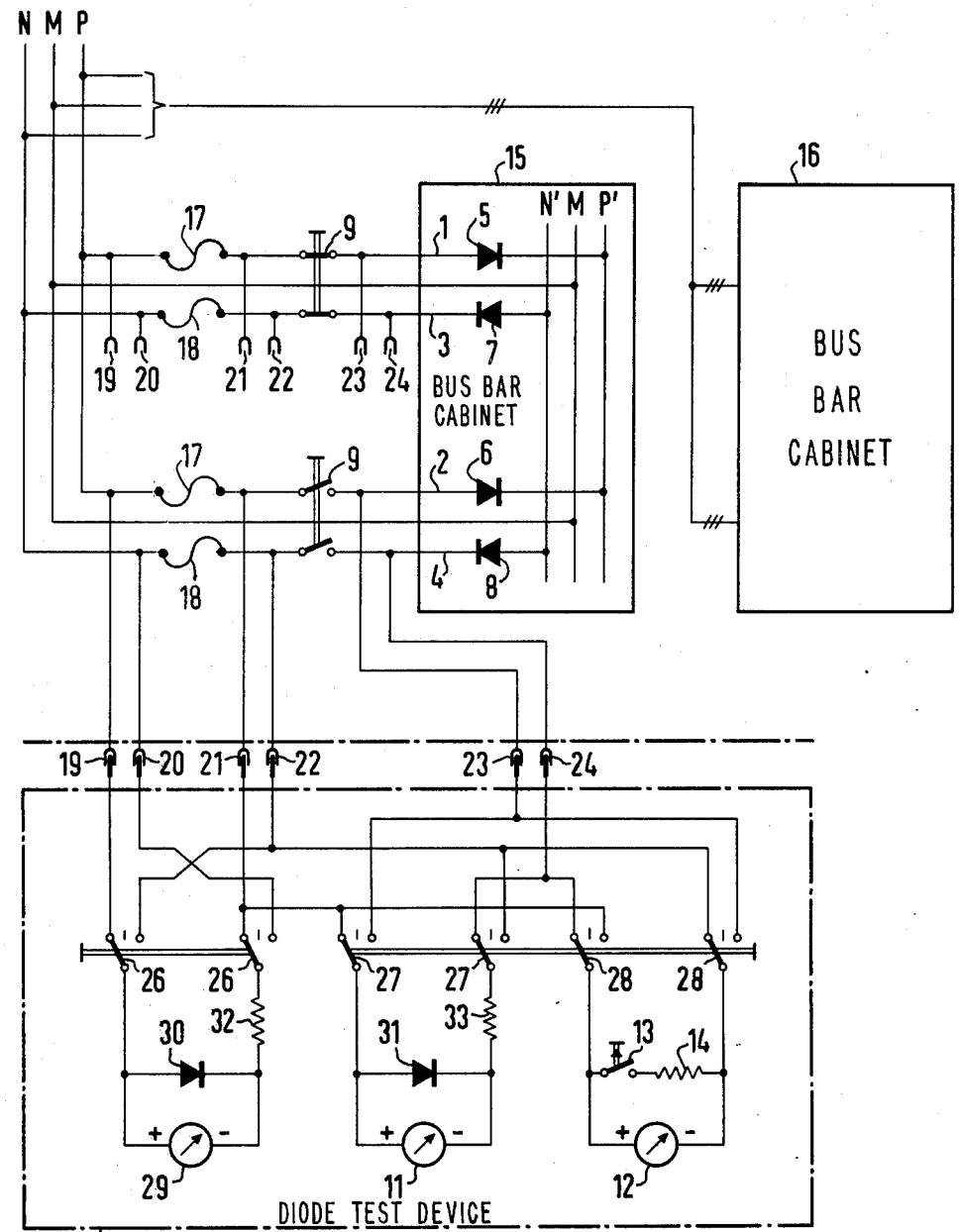
FIG. 2 is a schematic diagram of a practical implementation of the principles of the invention.

In FIG. 2, a practical realization of a diode testing arrangement according to the invention is shown. This can be connected to the leads of the feed diodes to be checked in a very simple manner and permits, by means of simple switching, the checking of diodes of different polarities, i.e., diodes associated with bus bars of different polarity, without changing the lead connections.

The d.c. installation corresponds in principle to the arrangement depicted in FIG. 1. In addition, the center terminal M of the d.c. voltage source N and P is shown. The d.c. bus bars N' and P', which may, for instance, be located in cabinets 15 and 16, are again supplied via the feed lines 1 to 4 and the feed diodes 5 to 8. The feed lines 1 to 4 are provided with fuses 17, 18 and disconnect switches 9. The disconnect switch 9 in FIG. 2 performs the same function as the switch designated with 9 in FIG. 1, and in general, the same designations as in FIG. 1 have been retained for elements of the same function. The ends of the fuses 17 and 18, as well as the ends of the diodes 5 to 8 not connected to the d.c. bus bars N' and P' are brought out to jacks 19 to 24, into which plug pins, attached to the diode checking device 25 can be inserted. These plug pins are connected with contacts of three double-throw switches 26, 27 and 28. The latter ensure the correct current flow direction through the corresponding measuring instrument, depending on the polarity of the diode 6 or 8, respectively, to be checked. Here, the switch 27 takes over the function of the switch 10 according to FIG. 1 and therefore applies the appropriate reverse potential to the anode or the cathode of the diode to be checked.

For checking the conducting state, there is provided another voltmeter 29, which can be connected in parallel to one of the two fuses 17 or 18 by the double-throw switch 26. Voltmeter 29 indicates a corresponding voltage drop in the range of millivolts if the diode is conducting when the switch 9 is closed.

The cut-off current or reverse-voltage test takes place, as in the case of FIG. 1, with the switch 9 open. The cut-off test of the diode 8 is performed for the position shown of the switches 27 and 28. Switches 27 and 28 are ganged to each other so that they can be operated together. In the other position of the switches 27 and 28 the cut-off test would be performed for the feed diode 6.

The voltmeter 29 and the ammeter 11 are advantageously provided with protective diodes 20 and 31 as well as with current-limiting resistors 32 and 33, to prevent destruction of the measuring instruments through an overload.

When the functional test of the diodes 6 and 8 is completed, the diode test device 25 can be plugged into the jacks 19 to 24 associated with the feed lines 1 and 3 and a corresponding functional test can be performed for the diodes 5 and 7. It is important to note that the current supply of the bus bars N' and P' is maintained, as before, by the parallel feed lines, 2 and 4.

Since the feed lines for the d.c. bus bars in the other cabinets are equipped with the jacks similar to 19 to 24, only one diode test device is required. A further simplification with respect to the number of the plug connections to be provided in the diode test device 25 is obtained if the plug connections 21 and 22 are dispensed with and the contacts of the switch 26 associated with them are connected with the plugs 23 and 24. In that case it is advisable to see to it that with the switch 9 open, the switch 26 is always in its center position, so that the voltmeter 29 does not get voltage.

Other variations in the embodiments described above will be apparent to those skilled in the art. The breadth of the invention is not to be limited to that described above, but is to be restricted to the scope of the attached claims.

What is claimed is:

1. An arrangement for testing diodes interposed in parallel feed lines between the terminals of a d.c. voltage source and corresponding d.c. bus bars which comprises:
    a. a first switching means positioned between a first side of the diode to be tested and a terminal of said voltage source of first polarity;
    b. a second switching means connected to the terminal of said voltage source of opposite polarity; and
    c. current measuring means connecting said second switching means to said first side of the diode to be tested, said current measuring means adapted to monitor the cut-off current flowing through said diode to be tested when said first switching means is opened and said second switching means is closed.

2. The arrangement of claim 1 wherein said second switching means is a double-pole, double-throw switch, said double-pole, double-throw switch operatively connected between the terminals of said voltage source, through said current measuring means, to said first side of at least two diodes to be tested, said operative connection enabling the determination of the cut-off current of one of said two diodes when said double-pole, double-throw switch is in a first position and the determination of the cut-off current of the remaining diode of said two diodes when said double-pole, double-throw switch is in a second position.

3. The arrangement of claim 1 further comprising:
    a. fuses positioned in series with said feed lines;
    b. third switching means connected in parallel with said fuses; and
    c. voltage measuring means operatively connected, by said third switching means in parallel with a different one of said fuses, depending on the switch position of said third switching means.

4. The arrangement of claim 1 wherein said current measuring means is an ammeter and wherein said arrangement further comprises a protective diode connected in parallel across said ammeter and a current limiting resistor serially connected with the parallel combination of said ammeter and protective diode.

5. The arrangement of claim 1 wherein means for detecting voltage is placed in parallel across the contacts of said first switching means.

6. The arrangement of claim 5 further comprising:
    a. third switching means; and
    b. a resistor having a resistance value corresponding to the minimum acceptable cut-off resistance of the diodes under test, said third switching means and said resistor connected in series with each other and together connected in parallel with said voltage detecting means.

7. The arrangement of claim 6 further comprising:
    a. fuses positioned in series with said feed lines;
    b. fourth switching means connected in parallel with said fuses; and
    c. second voltage detecting means operatively connected, by said fourth switching means in parallel with a different one of said fuses, depending on the switch position of said fourth switching means.

8. The arrangement of claim 7 wherein said current measuring means is an ammeter and wherein said arrangement further comprises corresponding protective diodes connected in parallel with said ammeter, and said second voltage detecting means, in corresponding current limiting resistors serially connected with the parallel combinations of said diodes with said ammeter and with said second voltage detecting means.

9. The arrangement according to claim 8 characterized in that said second, third and fourth switching means, said current measuring means, and said first and second voltage detecting means are structurally combined in one unit, said unit further including plug connections for detachably connecting said unit to corresponding ends of said fuses, said first switching means and said diodes to be tested.

* * * * *